(12) United States Patent
Xu et al.

(10) Patent No.: US 11,133,488 B2
(45) Date of Patent: Sep. 28, 2021

(54) DISPLAY SUBSTRATE, DISPLAY APPARATUS, AND METHOD OF FABRICATING DISPLAY SUBSTRATE HAVING ENCLOSURE RING IN BUFFER AREA

(71) Applicant: BOE Technology Group Co., Ltd., Beijing (CN)

(72) Inventors: Chuanxiang Xu, Beijing (CN); Shi Shu, Beijing (CN); Qi Yao, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 10 days.

(21) Appl. No.: 16/639,927

(22) PCT Filed: Oct. 21, 2019

(86) PCT No.: PCT/CN2019/112205
§ 371 (c)(1),
(2) Date: Feb. 18, 2020

(87) PCT Pub. No.: WO2020/215630
PCT Pub. Date: Oct. 29, 2020

(65) Prior Publication Data
US 2021/0135155 A1    May 6, 2021

(30) Foreign Application Priority Data

Apr. 26, 2019    (CN) .......................... 201910343935.2

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 51/525* (2013.01);
(Continued)

(58) Field of Classification Search
CPC .............. H01L 51/5246; H01L 51/525; H01L 51/5259; H01L 51/56; H01L 27/3244
See application file for complete search history.

(56) References Cited

U.S. PATENT DOCUMENTS

2017/0040347 A1* 2/2017 Seo .................... H01L 51/5246
2019/0041915 A1* 2/2019 Park ................... H01L 27/3262
(Continued)

FOREIGN PATENT DOCUMENTS

| CN | 107180923 A | 9/2017 |
| CN | 107910350 A | 4/2018 |
| CN | 108666347 A | 10/2018 |

OTHER PUBLICATIONS

First Office Action in the Chinese Patent Application No. 201910343935.2 dated Sep. 27, 2020; English translation attached.

*Primary Examiner* — Michael Jung
(74) *Attorney, Agent, or Firm* — Intellectual Valley Law, P.C.

(57) ABSTRACT

A display substrate is provided. The display substrate includes a functional area; and a buffer area substantially surrounding the functional area, wherein the functional area includes a display area and a peripheral area between the display area and the buffer area; one or more insulating layers on a base substrate, and in the functional area and the buffer area; and an encapsulating structure on a side of the one or more insulating layers away from the base substrate, and encapsulating a plurality of light emitting elements in the display area. The one or more insulating layers include a first part in the functional area and at least a second part in the buffer area. The second part is spaced apart from the (Continued)

first part. The display substrate further includes a first enclosure ring on a side of the second part away from the base substrate.

15 Claims, 9 Drawing Sheets

(52) U.S. Cl.
CPC ...... *H01L 51/5253* (2013.01); *H01L 51/5259* (2013.01); *H01L 51/56* (2013.01); *H01L 2227/323* (2013.01)

(56) References Cited

U.S. PATENT DOCUMENTS

| | | | |
|---|---|---|---|
| 2019/0074479 A1* | 3/2019 | Lee | H01L 51/56 |
| 2019/0333972 A1 | 10/2019 | Ding et al. | |
| 2020/0006702 A1* | 1/2020 | Sonoda | G09F 9/30 |
| 2021/0066651 A1* | 3/2021 | Kishimoto | G09F 9/30 |

* cited by examiner

DISPLAY SUBSTRATE, DISPLAY APPARATUS, AND METHOD OF FABRICATING DISPLAY SUBSTRATE HAVING ENCLOSURE RING IN BUFFER AREA

CROSS-REFERENCE TO RELATED APPLICATION

This application is a national stage application under 35 U.S.C. § 371 of International Application No. PCT/CN2019/112205, filed Oct. 21, 2019, which claims priority to Chinese Patent Application No. 201910343935.2, filed Apr. 26, 2018. Each of the forgoing applications is herein incorporated by reference in its entirety for all purposes.

TECHNICAL FIELD

The present invention relates to display technology, more particularly, to a display substrate, a display apparatus, and a method of fabricating a display substrate.

BACKGROUND

In present, the organic light emitting diode (OLED) display apparatus attracts more and more attention, because the OLED display apparatus has many advantages including self-illumination, rich colors, fast reaction speed, wide viewing angle, high contrast ratio, low power consumption, lightness and thinness, and good flexibility.

SUMMARY

In one aspect, the present invention provides a display substrate, comprising a functional area; and a buffer area substantially surrounding the functional area, wherein the functional area comprises a display area and a peripheral area between the display area and the buffer area; one or more insulating layers on a base substrate, and in the functional area and the buffer area; and an encapsulating structure on a side of the one or more insulating layers away from the base substrate, and encapsulating a plurality of light emitting elements in the display area; wherein the one or more insulating layers comprise a first part in the functional area and at least a second part in the buffer area; and the second part is spaced apart from the first part; wherein the display substrate further comprises a first enclosure ring on a side of the second part away from the base substrate; the first enclosure ring forms an enclosure substantially surrounding the functional area; and a maximum width of the first enclosure ring along a cross-enclosure direction crossing the enclosure and from the display area toward the buffer area is greater than a minimum width of the second pan along the cross-enclosure direction.

Optionally, the one or more insulating layers comprises a first insulating layer and a second insulating layer; the first insulating layer comprises a first sub-part in the functional area and a second sub-part in the buffer area; the second insulating layer comprises a third sub-part in the functional area and a fourth sub-part in the buffer area; the first sub-part and the third sub-part form at least a portion of the first part; the second sub-part and the fourth sub-part form at least a portion of the second part; the first sub-part and the second sub-part are in a same layer and comprise a same insulating material; and the third sub-part and the fourth sub-part are in a same layer and comprise a same insulating material.

Optionally, the second part is spaced apart from the first part by at least a first groove.

Optionally, the display substrate further comprises a second enclosure ring between the second part and the first enclosure ring; and the second enclosure ring covers at least a lateral side of the second part; wherein the display substrate comprises a first recess between a first lateral side of the second enclosure ring and the first enclosure ring, and a second recess between a second lateral side of the second enclosure ring and the first enclosure ring; and the first recess is part of the first groove.

Optionally, the maximum width of the first enclosure ring along the cross-enclosure direction is greater than a width along the cross-enclosure direction of a surface of the second enclosure ring in direct contact with the first enclosure ring.

Optionally, the display substrate further comprises a residual encapsulating structure in the buffer area and on a side of the first enclosure ring away from the base substrate; wherein the residual encapsulating structure is spaced apart from the encapsulating structure by at least the first groove; and a maximum width of the residual encapsulating structure along the cross-enclosure direction is greater than a minimum width of the first enclosure ring along the cross-enclosure direction.

Optionally, the one or more insulating layers further comprise a third part in the buffer area, and on a side of the second part away from the first part; and the third part is spaced apart from the second part by at least a second groove.

Optionally, the first recess is part of the first groove; and the second recess is part of the second groove.

Optionally, the first insulating layer further comprises a fifth sub-part in the buffer area; the second insulating layer further comprises a sixth sub-part in the buffer area; the fifth sub-part and the sixth sub-part form at least a portion of the third part; the first sub-part, the second sub-part, and fifth sub-part are in a same layer and comprise a same insulating material; and the third sub-part, the fourth sub-part, and the sixth sub-part are in a same layer and comprise a same insulating material.

Optionally, the second enclosure ring comprises a metallic layer; and the first enclosure ring comprises a substantially transparent conductive layer.

Optionally, the display substrate further comprises a plurality of thin film transistors in the functional area; wherein a respective one of the plurality of thin film transistors comprises a source electrode and a drain electrode; a respective one of the plurality of light emitting elements comprises a first electrode and a second electrode; the second enclosure ring, the source electrode and the drain electrode of respective one of the plurality of thin film transistors are in a same layer and comprise a same material; and the first enclosure ring is in a same layer, and comprises a same material, as one of the first electrode and the second electrode.

Optionally, a cross-section of the second part along a plane perpendicular to a main surface of the base substrate and along the cross-enclosure direction cross-enclosure direction has a substantially trapezoidal shape.

Optionally, a cross-section of a combination of the second part and the second enclosure ring along a plane perpendicular to a main surface of the base substrate and along the cross-enclosure direction has a substantially trapezoidal shape.

Optionally, one or more insulating layers comprises a buffer layer, a gate insulating layer on a side of the buffer layer away from the base substrate, and an inter-layer dielectric layer on a side of the gate insulating layer away from the base substrate; the buffer layer comprises a first buffer part in the functional area, a second buffer part in the buffer area and outside the enclosure, and a third buffer part in the buffer area and between the first buffer part and the second buffer part; the gate insulating layer comprises a first gate insulating part in the functional area, a second gate insulating part in the buffer area and outside the enclosure, and a third gate insulating part in the buffer area and between the first gate insulating part and the second gate insulating part; the inter-layer dielectric layer comprises a first dielectric part in the functional area, a second dielectric part in the buffer area and outside the enclosure, and a third dielectric part in the buffer area and between the first dielectric part and the second dielectric part; and the second part comprises the third buffer part, the third gate insulating part, and the third dielectric part.

Optionally, a first groove extends through the one or more insulating layers and exposes a surface of a portion of the base substrate.

Optionally, the second enclosure ring comprises a first lateral side, a second lateral side, and a third side away from the base substrate and connecting the first lateral side and the second lateral side; the first groove abuts the first lateral side of the second enclosure ring; and the second groove abuts the second lateral side of the second enclosure ring.

Optionally, the first recess is between a side of the first enclosure ring closer to the base substrate and the first lateral side of the second enclosure ring; and the second recess is between the side of the first enclosure ring closer to the base substrate and the second lateral side of the second enclosure ring.

In another aspect, the present invention provides a display apparatus, comprising the display substrate described herein or fabricated by a method described herein; and one or more integrated circuits electrically connected to the display substrate.

In another aspect, the present invention provides a method of fabricating a display substrate, comprising forming one or more insulating layers on a base substrate, and in a functional area and a buffer area, wherein the buffer area is substantially surrounding the functional area, and the functional area comprises a display area and a peripheral area between the display area and the buffer area; forming an encapsulating structure on a side of the one or more insulating layers away from the base substrate to encapsulate a plurality of light emitting elements in the display area; wherein the one or more insulating layers are formed to comprise a first part in the functional area and at least a second part in the buffer area; and the second part is formed to be spaced apart from the first part; wherein the method further comprises forming a first enclosure ring on a side of the second part away from the base substrate; the first enclosure ring is formed to form an enclosure substantially surrounding the functional area; and a maximum width of the first enclosure ring along a cross-enclosure direction cross the enclosure and from the display area toward the buffer area is greater than a minimum width of the second part along the cross-enclosure direction.

Optionally, forming the one or more insulating layers comprises forming one or more insulating material layers on the base substrate; and forming at least a first groove in the buffer area, wherein forming the first groove comprises patterning the one or more insulating material layers to form the first part in the functional area and the second part in the buffer area, the second part spaced apart from the first part by at least the first groove; the method further comprises depositing a first electrode material layer on a side of the one or more insulating layers away from the base substrate; patterning the first electrode material layer to form a source electrode and a drain electrode of a respective one of a plurality of thin film transistors in the functional area, and a precursor second enclosure ring on a side of the second part away from the base substrate; depositing a second electrode material layer on a side of the source electrode and the drain electrode away from the base substrate; patterning the second electrode material layer to form one of a first electrode and a second electrode of a respective one of a plurality of light emitting elements in the functional area, and the first enclosure ring; etching the precursor second enclosure ring using the first enclosure ring as a mask plate and using an etchant that selectively etches the precursor second enclosure ring over the first enclosure ring, to form a second enclosure ring, wherein a first recess is formed between a first lateral side of the second enclosure ring and the first enclosure ring, and a second recess is formed between a second lateral side of the second enclosure ring and the first enclosure ring; depositing one or more encapsulating materials on a side of the plurality of light emitting elements away from the base substrate, wherein the one or more encapsulating materials are deposited to form an encapsulated structure encapsulating the plurality of light emitting elements in the display area and a residual encapsulating structure in the buffer area and on a side of the first enclosure ring away from the base substrate; subsequent to depositing the one or more encapsulating materials, the residual encapsulating structure is isolated from the encapsulated structure by at least the first groove.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
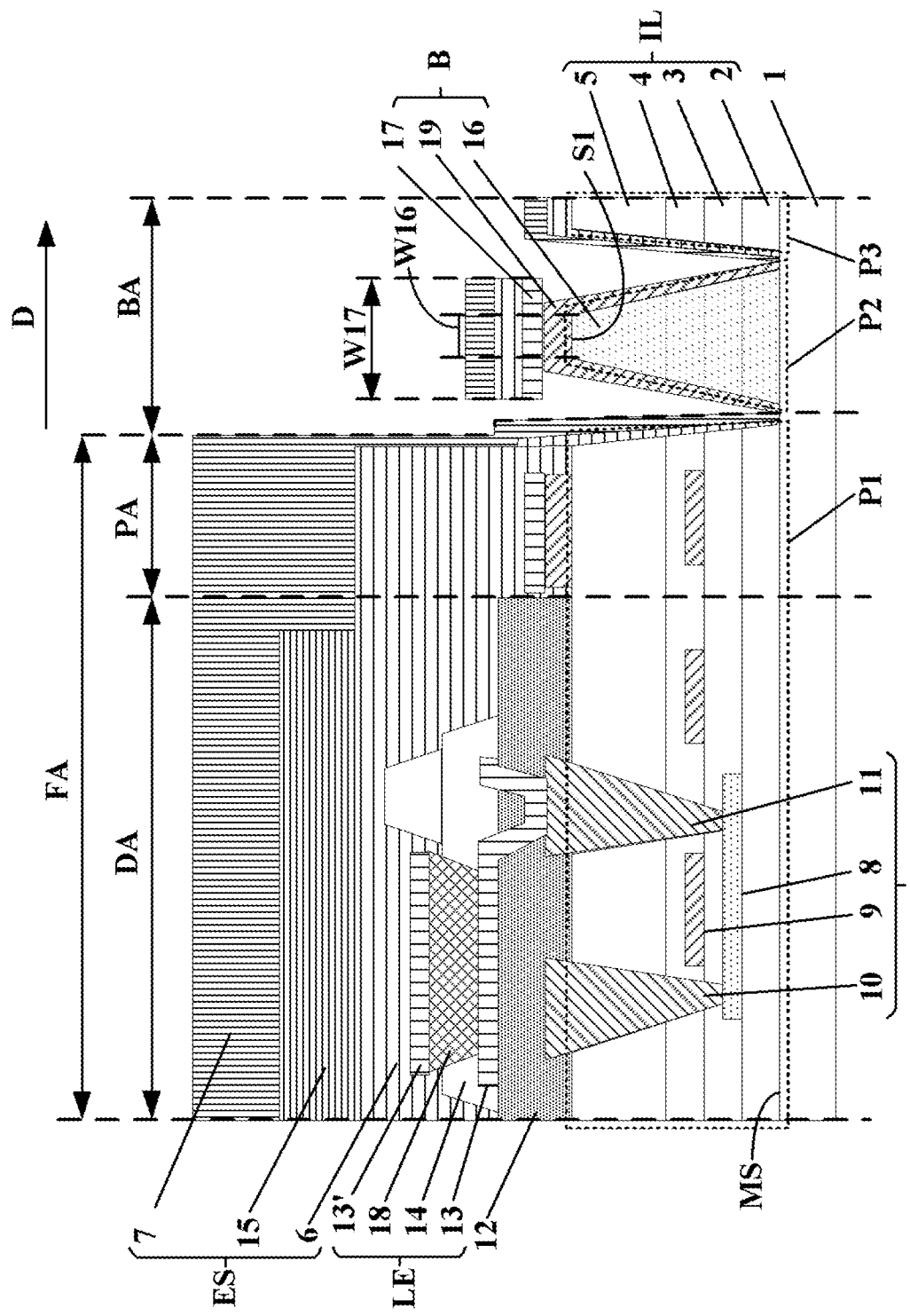
FIG. 1 is a schematic diagram of a structure of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

During a process of fabricating an OLED display substrate, a mother substrate is cut along a boundary of the display substrate region, to obtain the OLED display substrate. However, during the process of cutting the mother substrate, cracks may be formed in an organic material layer in the buffer area, and the crack may propagate towards the display area, resulting that air and oxygen in the air enters into the display substrate through the cracks, which may have an adverse effect on the display quality of the display substrate.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a functional area; and a buffer area substantially surrounding the functional area. Optionally, the functional area includes a display area and a peripheral area between the display area and the buffer area. Optionally, the display substrate includes one or more insulating layers on a base substrate, and in the functional area and the buffer area: and an encapsulating structure on a side of the one or more insulating layers away from the base substrate, and encapsulating a plurality of light emitting elements in the display area. Optionally, the one or more insulating layers include a first part in the functional area and at least a second part in the buffer area. Optionally, the second part is spaced apart from the first part by at least a first groove. Optionally, the display substrate further includes a first enclosure ring on a side of the second part away from the base substrate. Optionally, the first enclosure ring forms an enclosure substantially surrounding the functional area. Optionally, a maximum width of the first enclosure ring along a cross-enclosure direction cross the enclosure and from the display area toward the buffer area is greater than a minimum width of the second part along the cross-enclosure direction.

Optionally, the second part of the one or more insulating layers forms a first portion of a crack prevention barrier in the buffer area configured to prevent cracks in an inorganic layer in the buffer area from propagating into the functional area. Optionally, the crack prevention barrier further includes a first enclosure ring on a side of the first portion away from the base substrate. Optionally, the crack prevention barrier further includes a second enclosure ring between the first portion and the first enclosure ring.

FIG. 1 is a schematic diagram of a structure of a display substrate in some embodiments according to the present disclosure. In some embodiments, referring to FIG. 1, the display substrate includes a functional area FA; and a buffer area BA substantially surrounding the functional area FA. Optionally, the functional area FA includes a display area DA and a peripheral area PA between the display area DA and the buffer area BA.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In some embodiments, the display substrate includes one or more insulating layers IL on a base substrate 1, and in the functional area FA and the buffer area BA; and an encapsulating structure ES on a side of the one or more insulating layers IL away from the base substrate 1, and encapsulating a plurality of light emitting elements LE in the display area DA. Optionally, the one or more insulating layers IL are discontinuous in the buffer area BA.

Optionally, the display substrate is a rigid display substrate. Various appropriate materials may be used for making the base substrate, examples of materials suitable for making the base substrate include, but are not limited to, glass and quartz. Optionally, the display substrate is a flexible display substrate. Various appropriate materials may be used for making the base substrate, examples of materials suitable for making the base substrate include, but are not limited to polyimide materials.

Figure 2:
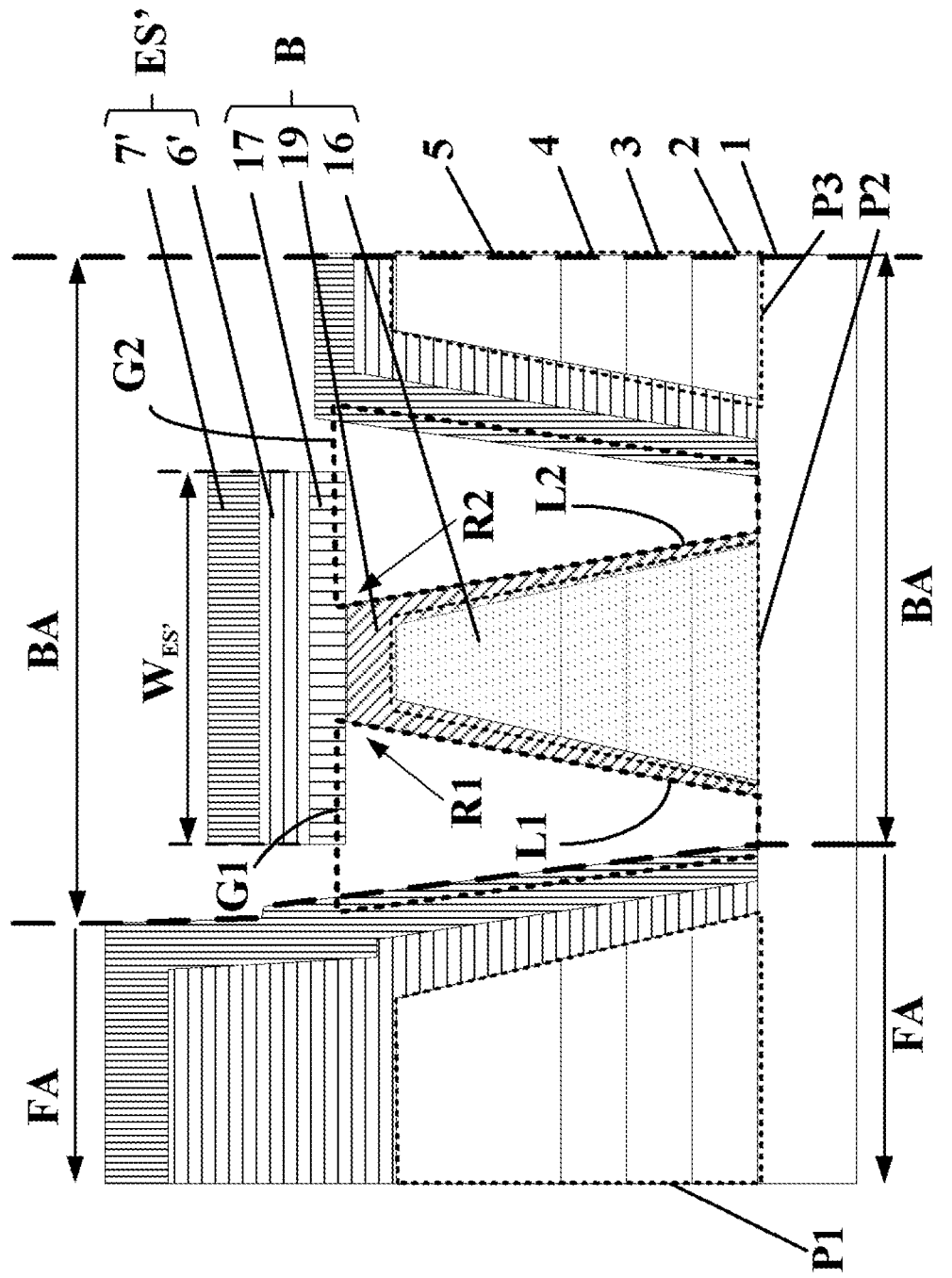
FIG. 2 is a schematic diagram of a structure of a second part, a first enclosure ring, a second enclosure ring, and a residual encapsulating structure in some embodiments according to the present disclosure.

FIG. 2 is a schematic diagram of a structure of a second part, a first enclosure ring, a second enclosure ring, and a residual encapsulating structure in some embodiments according to the present disclosure. In some embodiments, referring to FIG. 1 and FIG. 2, the one or more insulating layers IL include a first part P1 in the functional area FA and at least a second part P2 in the buffer area BA. Optionally, the second part P2 is spaced apart from the first part P1 by at least a first groove G1. Optionally, any and all insulating layers on the base substrate 1 and in the functional area FA is spaced apart from any and all insulating layers on the base substrate 1 and in the buffer area BA, e.g., by the first groove G1.

In some embodiments, the second part P2 of the one or more insulating layers IL forms a first portion 16 of a crack prevention barrier B in the buffer area BA configured to prevent cracks in an inorganic layer in the buffer area BA from propagating into the functional area FA. Optionally, the inorganic layer is selected from a group consisting of the one or more insulating layers IL.

For example, a portion of the inorganic layer in the buffer area and outside the crack prevention barrier and a portion of the inorganic layer in the functional area are spaced apart by the crack prevention barrier. In the process of cutting the mother substrate to form the display substrate, cracks may be formed in the portion of the inorganic layer in the buffer area and outside the crack prevention barrier can be prevented from propagating into the portion of the inorganic layer in the functional area by the crack prevention barrier. Since portions of the inorganic layer are spaced apart in the buffer are, and cracks cannot extend into the inorganic layer in the display area, no air and vapor can be transmitted into the function area via cracks, which can ensure a good display quality and long-term reliability of the display substrate.

In some embodiments, display substrate further includes a first enclosure ring 17 on a side of the second part P2 away from the base substrate 1.

Figure 3A:
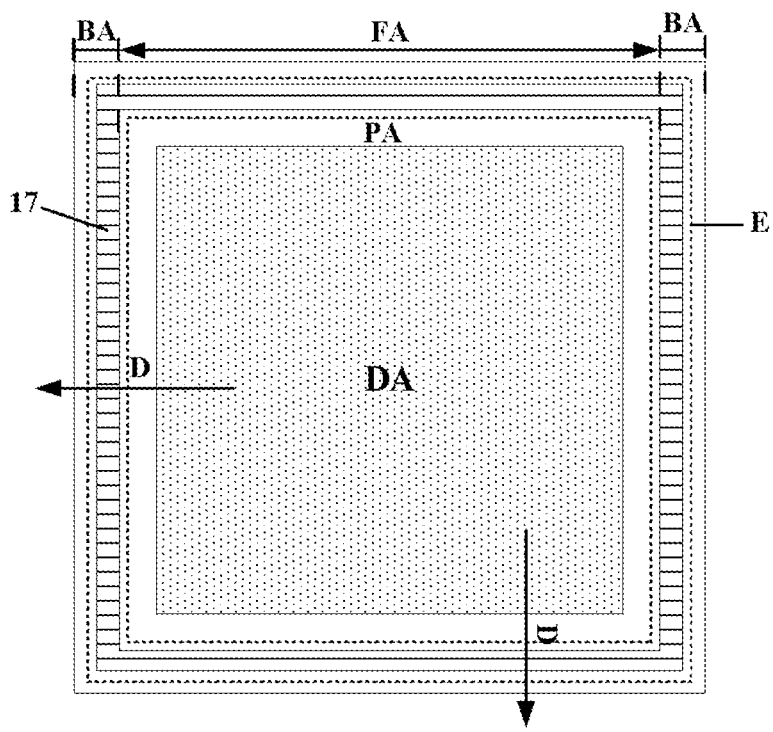
FIG. 3A is a plan view of a structure of a first enclosure ring in some embodiments according to the present disclosure.
Figure 3B:
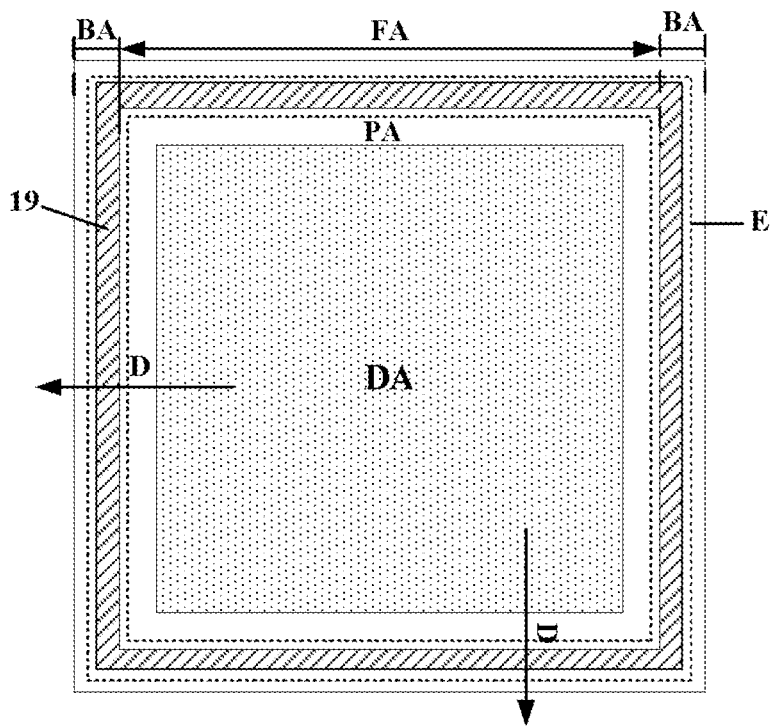
FIG. 3B is a plan view of a structure of a second enclosure ring in some embodiments according to the present disclosure.

FIG. 3A is a plan view of a structure of a first enclosure ring in some embodiments according to the present disclosure. FIG. 3B is a plan view of a structure of a second enclosure ring in some embodiments according to the present disclosure. Optionally, referring to FIG. 1 and FIG. 3A, the first enclosure ring 17 forms an enclosure E substantially surrounding the functional area FA. For example, in the process of cutting the mother substrate to form the display substrate, a portion of an inorganic layer in the buffer area and outside an area having the first enclosure ring is spaced apart from a portion of the inorganic layer in the functional area by the first enclosure ring, so that the inorganic layer is discontinuous in the buffer area.

As used herein the term "substantially surrounding" refers to surrounding at least 50% (e.g., at least 60%, at least 70%, at least 80%, at least 90%, at least 95%, at least 99%, and 100%) of a perimeter of an area. For example, the first enclosure ring 17 forms the enclosure E surrounding at least 60% of the perimeter of the function area FA.

As used herein the term "enclosure" refers to a structure at least partially (e.g., completely) surrounding a perimeter of an area. For example, the enclosure E formed by the first enclosure ring 17 at least partially (e.g., completely) surrounds the perimeter of the function area FA.

In some embodiments, referring to FIG. 1 and FIG. 3A, a maximum width W17 of the first enclosure ring 17 along a cross-enclosure direction D crossing the enclosure E and from the display area DA toward the buffer area BA is greater than a minimum width W16 of the second part P2 along the cross-enclosure direction D.

Optionally, the maximum width W17 of the first enclosure ring 17 along the cross-enclosure direction D is greater than a width along the cross-enclosure direction D of a surface S1 of the second part P2 closer to the first enclosure ring 17.

For example, an inorganic layer can be formed on a side of the first enclosure ring away from the base substrate, because along the cross-enclosure direction D, the maximum width of the first enclosure ring is greater than the width of the surface, closer to the first enclosure ring, of the second part, a portion of the inorganic layer covering the first enclosure ring and a portion of the inorganic layer uncovering the first enclosure ring can be naturally separated from each other to form an discontinuous layer.

Figure 4:
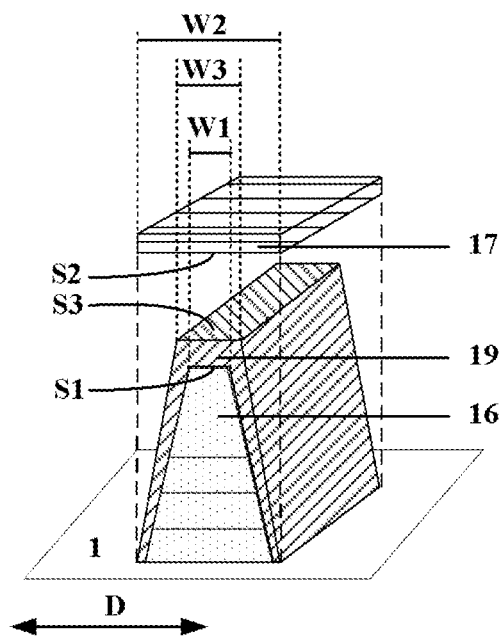
FIG. 4 is a schematic diagram of a structure of a second part, a first enclosure ring, and a second enclosure ring in some embodiments according to the present disclosure.

FIG. 4 is a schematic diagram of a structure of a second part, a first enclosure ring, and a second enclosure ring in some embodiments according to the present disclosure. Referring to FIG. 1 and FIG. 4, optionally, a width W2 along the cross-enclosure direction D of a surface S2 of the first enclosure ring 17 closer to the second part P2 is greater than the width W1 along the cross-enclosure direction D of a surface S1 of the second part P2 closer to the first enclosure ring 17. Optionally, an orthographic projection of the first enclosure ring 17 on the base substrate 1 substantially covers an orthographic projection, on the base substrate 1, of the surface S1 of the second part P2 closer to the first enclosure ring 17. Optionally, an orthographic projection, on the base substrate 1, of the surface S2 of the first enclosure ring 17 closer to the second part P2 substantially covers an orthographic projection, on the base substrate 1, of the surface S1 of the second part P2 closer to the first enclosure ring 17.

As used herein, the term "substantially covers" refers to one orthographic projection being at least 50%, at least 60%, at least 70%, at least 80%, at least 90%, at least 95%, at least 99%, or 100% covered by another orthographic projection. For example, the orthographic projection, on the base substrate 1, of the surface S1 of the second part P2 closer to the first enclosure ring 17 is at least 50% covered by the orthographic projection of the first enclosure ring 17 on the base substrate 1.

Figure 5:
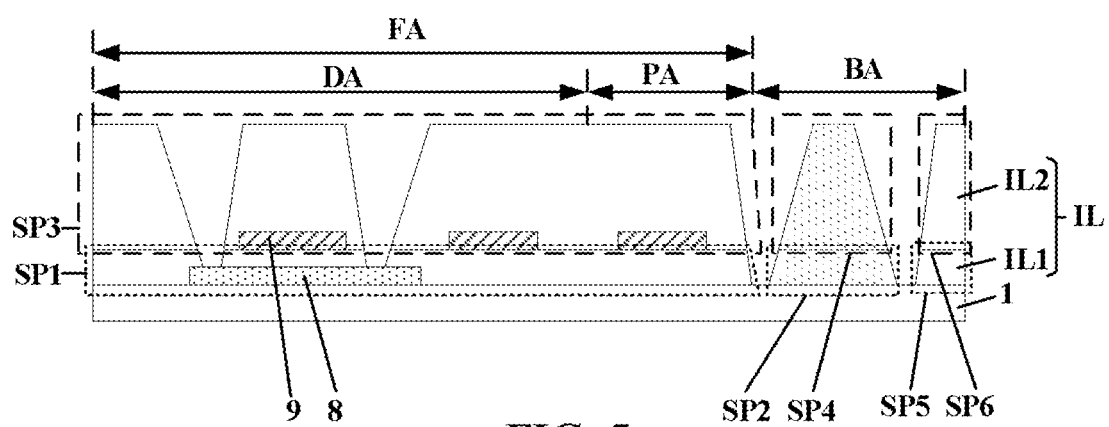
FIG. 5 is a schematic diagram of a structure of one or more insulating layers in some embodiments according to the present disclosure.

FIG. 5 is a schematic diagram of a structure of one or more insulating layers in some embodiments according to the present disclosure. In some embodiments, referring to FIG. 5, the one or more insulating layers IL includes a first insulating layer IL1 and a second insulating layer IL2. Optionally, the first insulating layer IL1 includes a first sub-part SP1 in the functional area FA and a second sub-part SP2 in the buffer area BA. Optionally, the second insulating layer IL2 includes a third sub-part SP3 in the functional area FA and a fourth sub-part SP4 in the buffer area BA.

Optionally, referring to FIG. 1 and FIG. 5, the first sub-part SP1 and the third sub-part SP3 form at least a portion of the first part P1. Optionally, the second sub-part SP2 and the fourth sub-part SP4 form at least a portion of the second part P2. Optionally, the first sub-part SP1 and the second sub-part SP2 are in a same layer and include a same insulating material, for example, an inorganic material. Optionally, the third sub-part SP3 and the fourth sub-part SP4 are in a same layer and include a same insulating material, for example, an inorganic material.

As used herein, the term "same layer" refers to the relationship between the layers simultaneously formed in the same step. In one example, the first sub-part and the second sub-part are in a same layer when they are formed as a result of one or more steps of a same patterning process performed in a material deposited in a same deposition process. In another example, the first sub-part and the second sub-part can be formed in a same layer by simultaneously performing the step of forming the first sub-part and the step of forming the second sub-part. The term "same layer" does not always mean that the thickness of the layer or the height of the layer in a cross-sectional view is the same.

Figure 6:
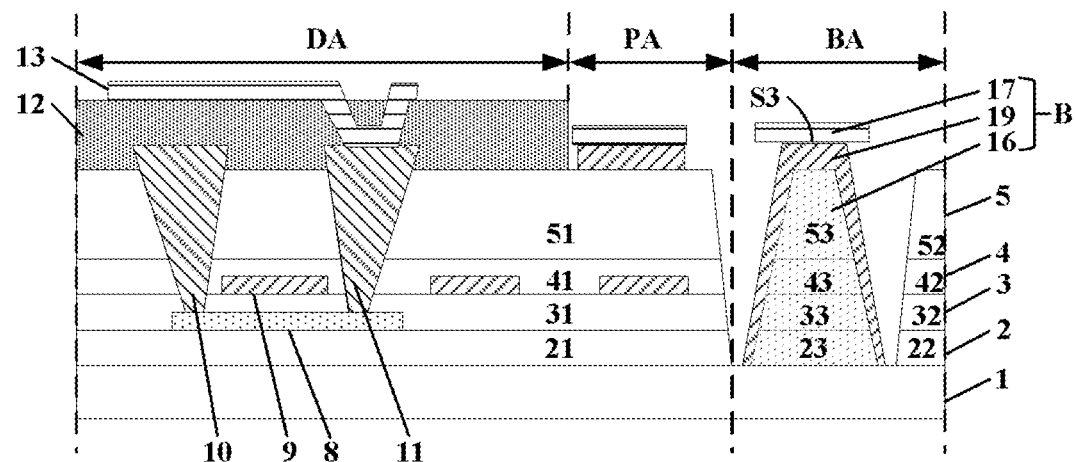
FIG. 6 is a schematic diagram of a structure of one or more insulating layers in some embodiments according to the present disclosure.

FIG. 6 is a schematic diagram of a structure of one or more insulating layers in some embodiments according to the present disclosure. In some embodiments, referring to FIG. 6, one or more insulating layers IL include a buffer layer 2, a gate insulating layer 3 on a side of the buffer layer 2 away from the base substrate 1, and an inter-layer dielectric layer 5 on a side of the gate insulating layer 3 away from the base substrate 1. Optionally, the one or more insulating layers IL further include a second gate insulating layer 4 between the gate insulating layer 3 and the inter-layer dielectric layer 5.

Optionally, referring to FIG. 5 and FIG. 6, the first insulating layer IL1 and the second insulating layer IL2 are different layers selected from a group consisting of the buffer layer 2, the gate insulating layer 3, the second gate insulating layer 4, and the inter-layer dielectric layer 5.

Optionally, the buffer layer 2 includes a first buffer part 21 in the functional area FA, a second buffer part 22 in the buffer area BA and outside the enclosure (e.g., the crack preventive barrier B), and a third buffer part 23 in the buffer area BA and between the first buffer part 21 and the second buffer part 22.

Optionally, the gate insulating layer 3 includes a first gate insulating part 31 in the functional area FA, a second gate insulating part 32 in the butler area BA and outside the enclosure, and a third gate insulating part 33 in the buffer area BA and between the first gate insulating part 31 and the second gate insulating part 32.

Optionally, the second gate insulating layer 4 includes a fourth gate insulating part 41 in the functional area FA, a fifth gate insulating part 42 in the buffer area BA and outside the enclosure, and a sixth gate insulating part 43 in the buffer area BA and between the fourth gate insulating part 41 and the fifth gate insulating part 42.

Optionally, the inter-layer dielectric layer 5 includes a first dielectric part 51 in the functional area FA, a second dielectric part 52 in the buffer area BA and outside the enclosure, and a third dielectric part 53 in the buffer area BA and between the first dielectric part 51 and the second dielectric part 52.

Optionally, the second part P2 includes the third buffer part 23, the third gate insulating part 33, and the third dielectric part 53. Optionally, the second part P2 further includes the sixth gate insulating part 43.

In some embodiments, referring to FIG. 1 and FIG. 2, display substrate further includes a second enclosure ring 19 between the second part P2 and the first enclosure ring 17. Optionally, the second enclosure ring 19 covers at least a lateral side of the second part P2.

Referring to FIG. 1, FIG. 2, and FIG. 3B, the second enclosure ring 19 forms an enclosure E substantially surrounding the functional area FA. For example, in the process of cutting the mother substrate to form the display substrate, a portion of an inorganic layer in the buffer area and outside an area having the second enclosure ring is spaced apart from a portion of the inorganic layer in the functional area by the first enclosure ring, so that the inorganic layer is discontinuous in the buffer area.

In some embodiments, the display substrate includes a first recess R1 between a first lateral side L1 of the second enclosure ring 19 and the first enclosure ring 17, and a second recess R2 between a second lateral side L2 of the second enclosure ring 19 and the first enclosure ring 17. Optionally, the first recess R1 is part of the first groove G1.

Optionally, referring to FIG. 1, FIG. 2, and FIG. 4, the maximum width W17 of the first enclosure ring 17 along the cross-enclosure direction D is greater than a width W3 along the cross-enclosure direction of a surface S3 of the second enclosure ring 19 in direct contact with the first enclosure ring 17.

For example, an inorganic layer can be formed on a side of the first enclosure ring, because along the cross-enclosure direction, the maximum width of the first enclosure ring is greater than the width of the surface of the second enclosure ring in direct contact with the first enclosure ring, a portion of the inorganic layer covering the first enclosure ring and a portion of the inorganic layer uncovering the second enclosure ring can be naturally separated from each other to from an discontinuous layer.

Optionally, the maximum width W17 of the first enclosure ring 17 along the cross-enclosure direction D is greater than a minimum width along the cross-enclosure direction D of a combination of the second part P2 and the second enclosure ring 19.

Optionally, an orthographic projection of the first enclosure ring 17 on the base substrate 1 substantially covers an orthographic projection, on the base substrate 1, of a surface S3 of the second enclosure ring 19 in direct contact with the first enclosure ring 17.

In some embodiments, referring to FIG. 1 and FIG. 2, the display substrate includes a residual encapsulating structure ES' in the buffer area BA and on a side of the first enclosure ring away from the base substrate 1. Optionally, the residual encapsulating structure ES' is spaced apart from the encapsulating structure ES by at least the first groove G1.

Optionally, the encapsulating structure ES includes a first inorganic layer 6, a second inorganic layer 7, and an organic layer 15. Optionally, the residual encapsulating structure ES' includes a first residual inorganic layer 6' and a second residual inorganic layer 7'.

Optionally, a maximum width $W_{ES'}$ of the residual encapsulating structure ES' along the cross-enclosure direction D is greater than a minimum width W17 of the first enclosure ring 17 along the cross-enclosure direction D.

Figure 7:
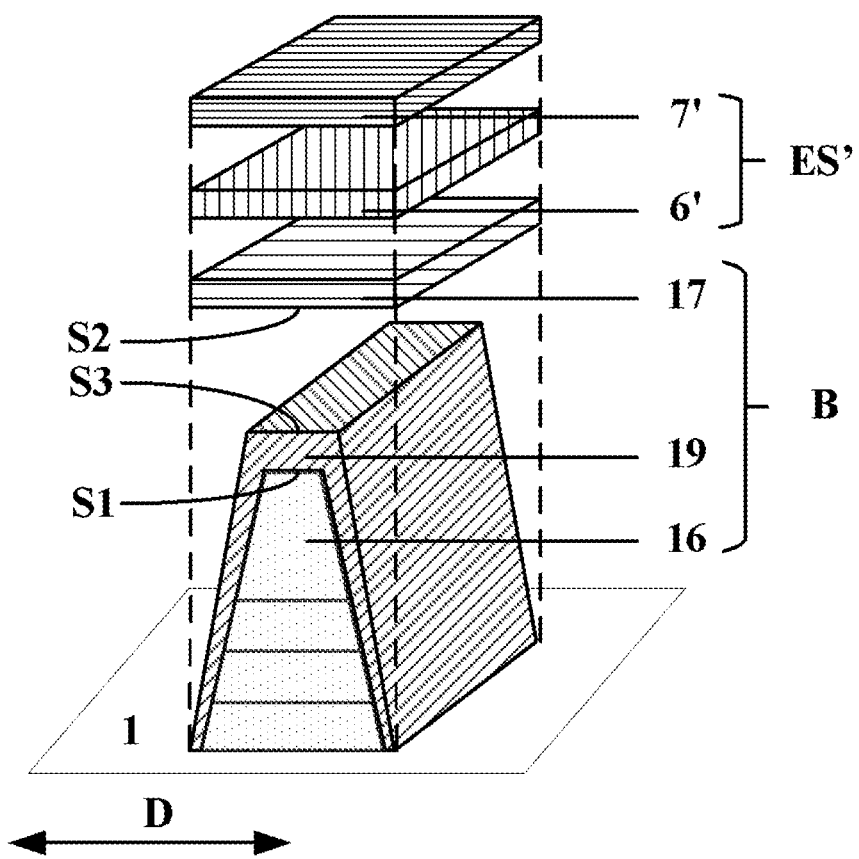
FIG. 7 is a schematic diagram of a structure of a residual encapsulating structure in some embodiments according to the present disclosure.

FIG. 7 is a schematic diagram of a structure of a residual encapsulating structure in some embodiments according to the present disclosure. Referring to FIG. 7, in some embodiments, an orthographic projection of the residual encapsulating structure ES' on the base substrate 1 substantially covers with an orthographic projection of the first enclosure ring 17 on the base substrate 1. Optionally, the orthographic projection of the residual encapsulating structure ES' on the base substrate 1 substantially covers the orthographic projection, on the base substrate 1, of a surface S3 of the second enclosure ring 19 in direct contact with the first enclosure ring 17. Optionally, the orthographic projection of the residual encapsulating structure ES' on the base substrate 1 substantially covers the orthographic projection, on the base substrate 1, of the surface S1 of the second part P2 closer to the first enclosure ring 17.

For example, the encapsulating structure ES and the residual encapsulating structure ES' are formed in a same process, and the first inorganic layer 6 and the first residual inorganic layer 6' are formed in a same layer and using a same material, the second inorganic layer 7 and the second residual inorganic layer 7' are formed in a same layer and using a same material.

Because along the cross-enclosure direction, the maximum width of the first enclosure ring is greater than the width of the surface of the second enclosure ring in direct contact with the first enclosure ring, the first inorganic material layer is formed on a side of the first enclosure ring, and a portion of the first inorganic material layer covering the first enclosure ring and a portion of the first inorganic material layer uncovering the first enclosure ring are naturally spaced apart without using an etching process, therefore, the portion of the first inorganic material layer covering the first enclosure ring forms the first residual inorganic layer, a portion of the first inorganic material layer uncovering the first enclosure ring and in the functional area forms the first inorganic layer.

Because along the cross-enclosure direction, the maximum width of the first enclosure ring is greater than the width of the surface of the second enclosure ring in direct contact with the first enclosure ring, the second inorganic material layer is formed on a side of first inorganic material layer away from the first enclosure ring, and a portion of the second inorganic material layer covering the first enclosure ring and a portion of the second inorganic material layer uncovering the first enclosure ring are naturally spaced apart without using an etching process, therefore, the portion of the second inorganic material layer covering the first enclosure ring forms the second residual inorganic layer, a portion of the first inorganic material layer uncovering the first enclosure ring and in the functional area forms the second inorganic layer.

In some embodiments, referring to FIG. 1, the one or more insulating layers IL further include a third part P3 in the buffer area BA, and on a side of the second part P2 away from the first part P1.

Optionally, referring to FIG. 1 and FIG. 2, the third part P3 is spaced apart from the second part P2 by at least a second groove G2. Optionally, referring to FIG. 2, the first recess R1 is part of the first groove G1; and the second recess R2 is part of the second groove G2.

In some embodiments, referring to FIG. 5, the first insulating layer IL1 further includes a fifth sub-part SP5 in the buffer area BA, the second insulating layer IL2 further includes a sixth sub-part SP6 in the buffer area BA.

Optionally, referring to FIG. 1 and FIG. 5, the fifth sub-part SP5 and the sixth sub-part SP6 form at least a portion of the third part P3. Optionally, the first sub-part SP1, the second sub-part SP2, and fifth sub-part SP5 are in a same layer and include a same insulating material, for example, an inorganic material. Optionally, the third sub-part SP3, the fourth sub-part SP4, and the sixth sub-part SP6 are in a same layer and include a same insulating material, for example, an inorganic material.

In some embodiments, the second enclosure ring includes a metallic layer. Optionally, the first enclosure ring B includes a substantially transparent conductive layer.

As used herein, the term "substantially transparent" means at least 50 percent (e.g., at least 60 percent, at least 70 percent, at least 80 percent, at least 90 percent, and at least 95 percent) of an incident light in the visible wavelength range transmitted there-through.

In some embodiments, referring to FIG. 1, the display substrate further includes a plurality of thin film transistors TFT in the functional area FA. Optionally, a respective one of the plurality of thin film transistors TFT includes a source electrode 10 and a drain electrode 11. Optionally, the second enclosure ring 19, the source electrode 10 and the drain electrode 11 of respective one of the plurality of thin film transistors TFT are in a same layer and include a same material, for example, a metallic material. By forming the second enclosure ring 19, the source electrode 10 and the drain electrode 11 of respective one of the plurality of thin film transistors TFT in a same process, the process of fabricating the display substrate can be simplified, and the cost of the display substrate can be reduced.

In some embodiments, a respective one of the plurality of light emitting elements LE includes a first electrode 13 and a second electrode 13'. Optionally, the first enclosure ring 17 is in a same layer, and includes a same material, as one of the first electrode 13 and the second electrode 13', which can simplify the process of fabricating the display substrate, and lower the cost of the display substrate.

In some embodiments, a cross-section of the second part P2 along a plane perpendicular to a main surface MS of the base substrate 1 and along the cross-enclosure direction D has a substantially trapezoidal shape.

As used herein, "substantially trapezoidal shape" can include shapes or geometries having at least one pair of substantially parallel sides (regardless of whether the other two sides include straight lines, curved lines or otherwise). As used herein, the term "substantially parallel sides" refers to two sides forming an included angle in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, or approximately 10 degrees to approximately 15 degrees. Optionally, the at least one pair of substantially parallel sides of the substantially trapezoidal shape includes a shorter side and a longer side, wherein the longer side is closer to the base substrate.

Various shapes may be adopted by the cross-section of the second part P2 as long as the maximum width W17 along the cross-enclosure direction D of the first enclosure ring 17 is greater than the width W1, along the cross-enclosure direction D, of the surface S1 of the second part P2 closer to the first enclosure ring 17.

Various shapes may be adopted by the cross-section of the second part P2, as long as the orthographic projection of the first enclosure ring 17 substantially covers the orthographic projection of the surface S1 of the second part P2 closer to the first enclosure ring 17.

In some embodiments, a cross-section of a combination of the second part P2 and the second enclosure ring 19 along the plane perpendicular to the main surface MS of the base substrate 1 and along the cross-enclosure direction D has a substantially trapezoidal shape.

Various shapes may be adopted by the cross-section of the second part P2, as long as the maximum width W17 along the cross-enclosure direction D of the first enclosure ring 17 is greater than the width W3, along the cross-enclosure direction D, of the surface S3 of the second enclosure ring 19 closer to the first enclosure ring 17.

Various shapes may be adopted by the cross-section of the second part P2, as long as the orthographic projection of the first enclosure ring 17 substantially covers the orthographic projection of the surface S3 of the second enclosure ring 19 closer to the first enclosure ring 17.

In some embodiments, referring to FIG. 2, the first groove G1 extends through the one or more insulating layers IL and exposes a surface of a portion of the base substrate 1. Optionally, the second part P2 of the one or more insulating layers IL buffer area BA and the first part P1 of the one or more insulating layers IL are spaced apart by the first groove G1. The first grooves G1 can prevent cracks in a portion of the one or more insulating layers in the buffer area from propagating into the portion of the one or more insulating layers in the functional area.

The second groove G2 extends through the one or more insulating layers IL and exposes a surface of a portion of the base substrate 1. Optionally, the third part P2 of the one or more insulating layers IL buffer area BA and the first part P1 of the one or more insulating layers IL are spaced apart by at least the second groove G2. The second grooves G2 can prevent cracks in a portion of the one or more insulating layers in the buffer area from propagating into the portion of the one or more insulating layers in the functional area.

In some embodiments, the second enclosure ring 19 includes a first lateral side L1, a second lateral side L2, and a third side (e.g., the surface S3 of the second enclosure ring 19 in direct contact with the first enclosure ring 17) away from the base substrate 1 and connecting the first lateral side L1 and the second lateral side L2. Optionally, the first groove G1 abuts the first lateral side L1 of the second enclosure ring 19. Optionally, the second groove G2 abuts the second lateral side L2 of the second enclosure ring 19.

In some embodiments, the first recess R1 is between a side of the first enclosure ring 17 closer to the base substrate 1 and the first lateral side L1 of the second enclosure ring 19. Optionally, the second recess R2 is between the side of the first enclosure ring 17 closer to the base substrate 1 and the second lateral side L2 of the second enclosure ring 19.

Optionally, the first recess R1 abuts the first lateral side L1 of the second enclosure ring 19 and the side of the first enclosure ring 17 closer to the base substrate 1. Optionally, the second recess R2 abuts the second lateral side L2 of the second enclosure ring 19 and the side of the first enclosure ring 17 closer to the base substrate 1.

The display substrate described herein can prevent cracks in an inorganic layer in the buffer area from propagating into the functional area, especially into the display area, which can ensure a good display quality of the display substrate and long-term liability of the display panel.

In another aspect, the present disclosure provides a display panel. In some embodiments, the display panel includes the display substrate described herein.

In another aspect, the present disclosure provides a display apparatus. In some embodiments, the display apparatus includes the display substrate described herein; and one or more integrated circuits electrically connected to the display substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes a circuit board, and a light guide plate.

In another aspect, the present disclosure also provides a method of fabricating a display substrate. In some embodiments, the method of fabricating the display substrate includes forming one or more insulating layers on a base substrate, and in a functional area and a buffer area. Optionally, the buffer area is substantially surrounding the functional area. Optionally, the functional area includes a display area and a peripheral area between the display area and the buffer area.

Optionally, the method of fabricating the display substrate includes forming an encapsulating structure on a side of the one or more insulating layers away from the base substrate to encapsulate a plurality of light emitting elements in the display area. Optionally, the one or more insulating layers are formed to include a first part in the functional area and at least a second part in the buffer area. Optionally, the second part is formed to be spaced apart from the first part by at least a first groove. Optionally, display substrate is formed to further include a first enclosure ring on a side of the second part away from the base substrate. Optionally, the first enclosure ring is formed to form an enclosure substantially surrounding the functional area. Optionally, a maximum width of the first enclosure ring along a cross-enclosure direction cross the enclosure and from the display area toward the buffer area is greater than a minimum width of the second part along the cross-enclosure direction.

Optionally, the second part of the one or more insulating layers is formed to form a first portion of a crack prevention barrier in the buffer area to prevent cracks in an inorganic layer in the buffer area from propagating into the functional area. Optionally, the crack prevention barrier is formed to further include a first enclosure ring on a side of the first portion away from the base substrate. Optionally, the crack prevention barrier is formed to further include a second enclosure ring between the first portion and the first enclosure ring.

In some embodiments, the one or more insulating layers is formed to include a first insulating layer and a second insulating layer. Optionally, the first insulating layer is formed to include a first sub-part in the functional area and a second sub-part in the buffer area. Optionally, the second insulating layer is formed to include a third sub-part in the functional area and a fourth sub-part in the buffer area. Optionally, the first sub-part and the third sub-part form at least a portion of the first part. Optionally, the second sub-part and the fourth sub-part form at least a portion of the second part. Optionally, the first sub-part and the second sub-part are formed from a same material deposited in a same depositing process. Optionally, the third sub-part and the fourth sub-part are formed from a same material deposited in a same depositing process.

In some embodiments, display substrate is formed to include a second enclosure ring between the second part and the first enclosure ring. Optionally, the second enclosure ring is formed to cover at least a lateral side of the second part. Optionally, the method further includes forming a first recess between a first lateral side of the second enclosure ring and the first enclosure ring, and a second recess between a second lateral side of the second enclosure ring and the first enclosure ring. Optionally, the first recess is formed to be part of the first groove.

In some embodiments, the maximum width of the first enclosure ring along the cross-enclosure direction is greater than a width along the cross-enclosure direction of a surface of the second enclosure ring in direct contact with the first enclosure ring.

In some embodiments, the method further includes forming a residual encapsulating structure in the buffer area and on a side of the first enclosure ring away from the base substrate. Optionally, the residual encapsulating structure is formed to be spaced apart from the encapsulating structure by at least the first groove. Optionally, a maximum width of the residual encapsulating structure along the cross-enclosure direction is greater than a minimum width of the first enclosure ring along the cross-enclosure direction.

In some embodiments, the one or more insulating layers are formed to include a third part in the buffer area, and on a side of the second part away from the first part. Optionally, the third part is formed to be spaced apart from the second part by at least a second groove. Optionally, the first recess is formed to be part of the first groove; and the second recess is formed to be part of the second groove.

In some embodiments, the first insulating layer is formed to further include a fifth sub-part in the buffer area, and the second insulating layer is formed to further include a sixth sub-part in the buffer area. Optionally, the fifth sub-part and the sixth sub-part form at least a portion of the third part. Optionally, the first sub-part, the second sub-part, and fifth sub-part are formed from a same material deposited in a same depositing process. Optionally, the third sub-part, the fourth sub-part, and the sixth sub-part are formed from a same material deposited in a same depositing process.

In some embodiments, the second enclosure ring is formed to include a metallic layer. Optionally, the first enclosure ring is formed to include a substantially transparent conductive layer.

In some embodiments, the method further includes forming a plurality of thin film transistors in the functional area. Optionally, a respective one of the plurality of thin film transistors is formed to include a source electrode and a drain electrode. Optionally, a respective one of the plurality of light emitting elements is formed to include a first electrode and a second electrode. Optionally, the second enclosure ring, the source electrode and the drain electrode of respective one of the plurality of thin film transistors are formed from a same material deposited in a same depositing process. Optionally, the first enclosure ring is formed from a same material depositing in a same depositing process, as one of the first electrode and the second electrode.

In some embodiments, a cross-section of the second part along a plane perpendicular to a main surface of the base substrate and along the cross-enclosure direction has a substantially trapezoidal shape.

Optionally, a cross-section of a combination of the second part and the second enclosure ring along a plane perpendicular to a main surface of the base substrate and along the cross-enclosure direction has a substantially trapezoidal shape.

In some embodiments, one or more insulating layers is formed to include a buffer layer, a gate insulating layer on a side of the buffer layer away from the base substrate, and an inter-layer dielectric layer on a side of the gate insulating layer away from the base substrate. Optionally, the one or more insulating layers is formed to further include a second gate insulating layer.

Optionally, the buffer layer is formed to include a first buffer part in the functional area, a second buffer part in the buffer area and outside the enclosure, and a third buffer part in the buffer area and between the first buffer part and the second buffer part.

Optionally, the gate insulating layer is formed to include a first gate insulating part in the functional area, a second gate insulating part in the buffer area and outside the enclosure, and a third gate insulating part in the buffer area and between the first gate insulating part and the second gate insulating part.

Optionally, the inter-layer dielectric layer is formed to include a first dielectric part in the functional area, a second dielectric part in the buffer area and outside the enclosure, and a third dielectric part in the buffer area and between the first dielectric part and the second dielectric part.

Optionally, the second part is formed to include the third buffer part, the third gate insulating part, and the third dielectric part.

In some embodiments, a first groove is formed extending through the one or more insulating layers and exposing a surface of a portion of the base substrate.

In some embodiments, the second enclosure ring is formed to include a first lateral side, a second lateral side, and a third side away from the base substrate and connecting the first lateral side and the second lateral side. Optionally, the first groove is formed to abut the first lateral side of the second enclosure ring. Optionally, the second groove is formed to abut the second lateral side of the second enclosure ring.

In some embodiments, the first recess is formed between a side of the first enclosure ring closer to the base substrate and the first lateral side of the second enclosure ring. In some embodiments, the second recess is formed between the side of the first enclosure ring closer to the base substrate and the second lateral side of the second enclosure ring.

Figure 8:
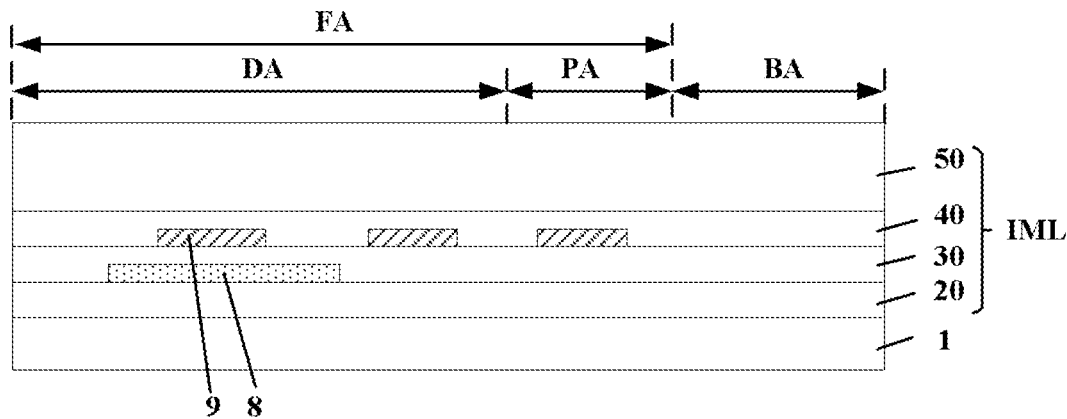
FIG. 8 is a schematic diagram illustrating a process of forming one or more insulating layers in some embodiments according to the present disclosure.
Figure 9:
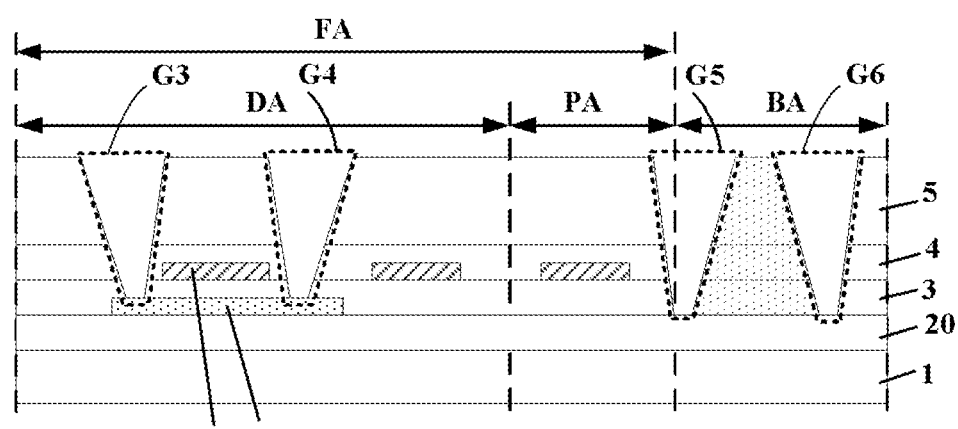
FIG. 9 is a schematic diagram illustrating a process of forming grooves extending through an insulating layer and an inter-layer dielectric layer in some embodiments according to the present disclosure.
Figure 10:
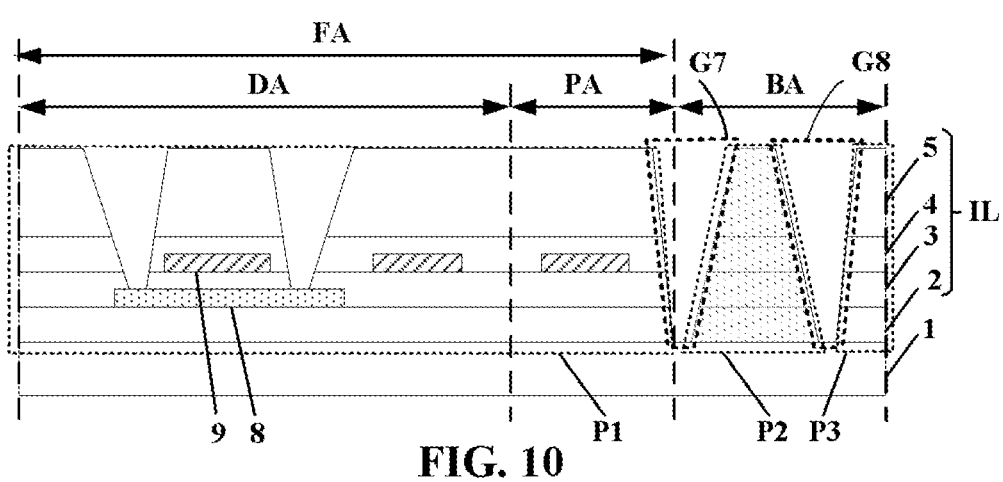
FIG. 10 is a schematic diagram illustrating a process for forming grooves in a buffer area extending through a buffer layer in some embodiments according to the present disclosure.
Figure 11:
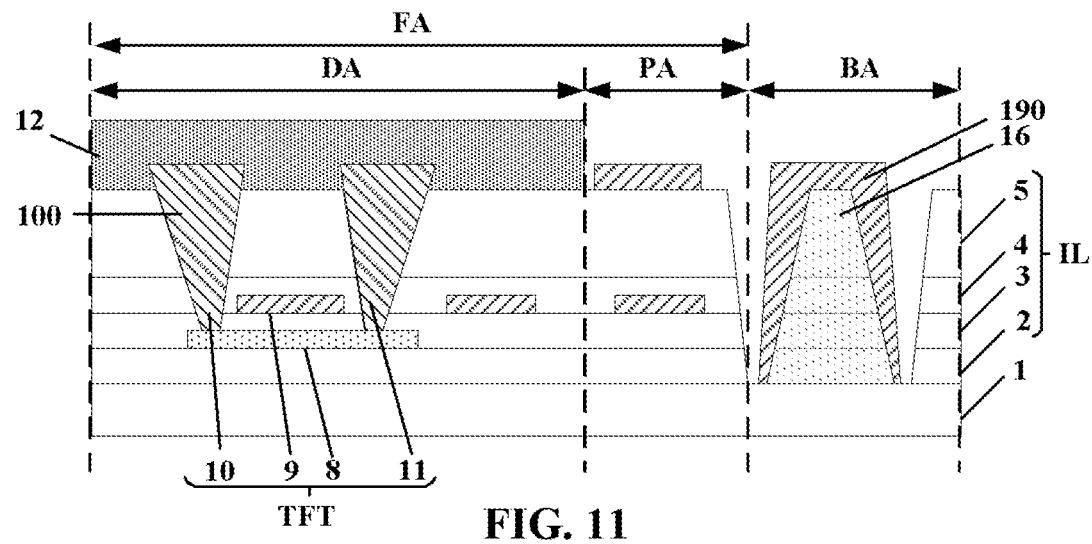
FIG. 11 is a schematic diagram illustrating a process of forming a source electrode, a drain electrode, and a second enclosure ring in some embodiments according to the present disclosure.
Figure 12:
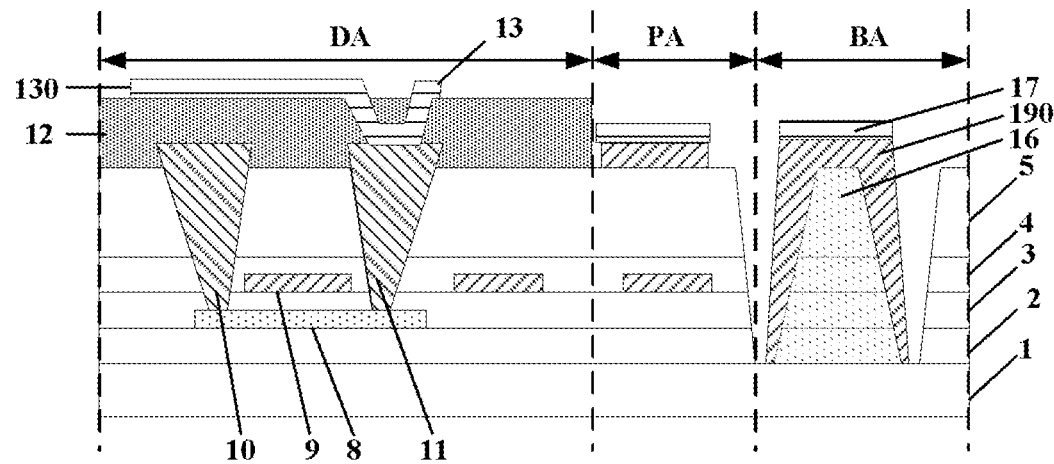
FIG. 12 is a schematic diagram illustrating a process of forming one of the first electrode and the second electrode, and a first enclosure ring in some embodiments according to the present disclosure.
Figure 13:
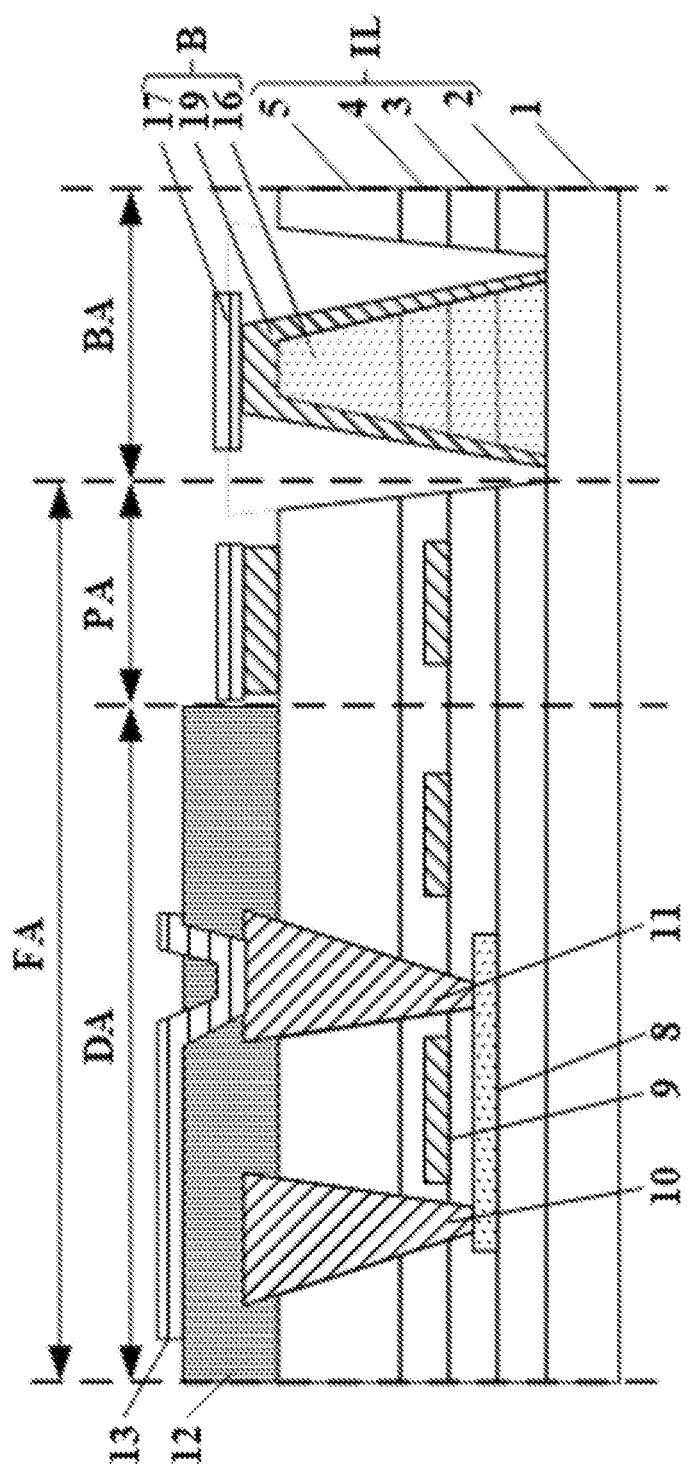
FIG. 13 is a schematic diagram illustrating a process of forming a first recess and a second recess in some embodiments according to the present disclosure.
Figure 14:
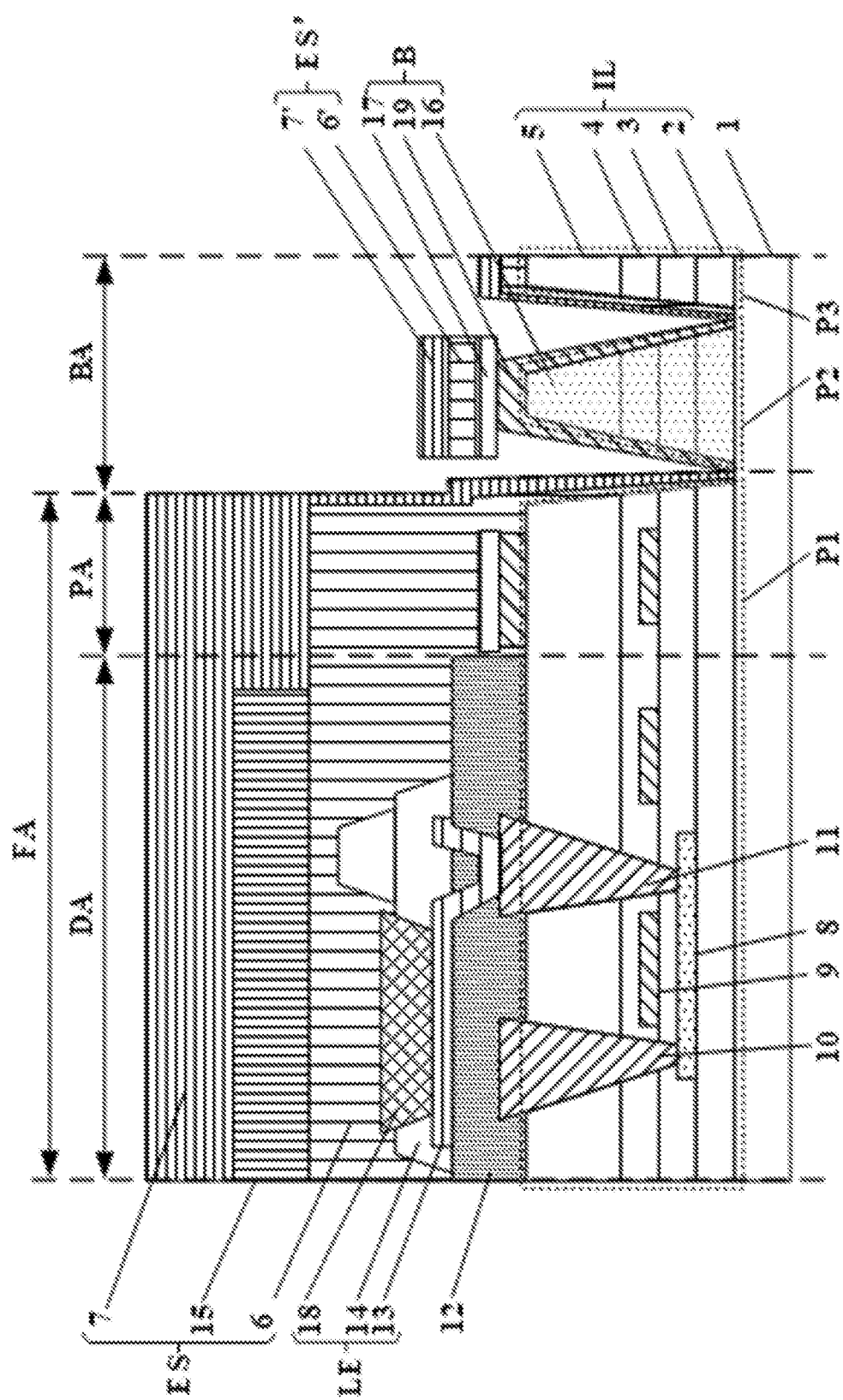
FIG. 14 is a schematic diagram illustrating a process of forming an encapsulating structure and a residual encapsulating structure in some embodiments according to the present disclosure.

FIG. 8 is a schematic diagram illustrating a process of forming one or more insulating layers in some embodiments according to the present disclosure. FIG. 9 is a schematic diagram illustrating a process of forming grooves extending through an insulating layer and an inter-layer dielectric layer in some embodiments according to the present disclosure. FIG. 10 is a schematic diagram illustrating a process for forming grooves in a buffer area extending through a buffer layer in some embodiments according to the present disclosure. FIG. 11 is a schematic diagram illustrating a process of forming a source electrode, a drain electrode, and a second enclosure ring in some embodiments according to the present disclosure. FIG. 12 is a schematic diagram illustrating a process of forming one of the first electrode and the second electrode, and a first enclosure ring in some embodiments according to the present disclosure. FIG. 13 is a schematic diagram illustrating a process of forming a first recess and a second recess in some embodiments according to the present disclosure. FIG. 14 is a schematic diagram illustrating a process of forming an encapsulating structure and a residual encapsulating structure in some embodiments according to the present disclosure.

In some embodiments, referring to FIG. 8, forming the one or more insulating layers IL includes forming one or more insulating material layers IML on the base substrate 1. For example, the one or more insulating material layers IML includes a buffer material layer 20, a gate insulating material layer 30, a second gate insulating material layer 40, and an inter-layer dielectric layer 50.

In some embodiments, referring to FIG. 9, the method further includes etching the one or more insulating material layers IML to form a third groove G3, a fourth groove G4, a fifth groove G5, and a six groove G6. Optionally, the third groove G3 and the fourth groove G4 are is formed in the display area DA to extend through the gate insulating material layer 30, the second gate insulating material layer 40, and the inter-layer dielectric layer 50, to expose a surface of an active layer 8. Optionally, the fifth groove G5 and the six groove G6 are formed to extend through the gate insulating material layer 30, the second gate insulating material layer 40, and the inter-layer dielectric layer 50, to expose a surface of the buffer material layer 20. Optionally, the third groove G3, the fourth groove G4, the fifth groove G5, and the six groove G6 are formed in a same etching process.

For example, photoresist are applied on a side of the inter-layer dielectric layer 50 away from the base substrate 1, an exposure process is performed on the photoresist using a mask, to form a photoresist retention region and a photoresist removal region. The third groove G3, the fourth groove G4, the fifth groove G5, and the six groove G6 are formed in the photoresist removal region. By forming the third groove G3, the fourth groove G4, the fifth groove G5, and the six groove G6 extending through the gate insulating material layer 30, the second gate insulating material layer 40, and the inter-layer dielectric layer 50, the gate insulating layer 3, the second gate insulating layer 4, and the inter-layer dielectric layer 5 are formed.

In some embodiments, referring to FIG. 10, the method farther includes etching the buffer material layer 20 to extend the fifth groove G5 into a seventh groove G7 and extend the sixth groove G6 into an eighth groove G8. Optionally, the seventh groove G7 and the eighth groove G8 are formed to expose a surface of the base substrate 1. By forming the seventh groove G7 and the eighth groove G8, the buffer layer 2 are formed.

Optionally, subsequent to forming the seventh groove G7, the first part P1 in the functional area FA and the second part P2 in the buffer area BA are formed. Optionally, the second part P2 is spaced apart from the first part P1 by at least the seventh groove G7.

In some embodiments, referring to FIG. 11, the method further includes depositing a first electrode material layer 100 on a side of the one or more insulating layers IL away from the base substrate 1; and patterning the first electrode material layer 100 to form a source electrode 10 and a drain electrode 11 of the respective one of the plurality of thin film transistors TFT in the functional area FA, and a precursor second enclosure ring 190 on a side of the second part P2 away from the base substrate 1. For example, the first electrode material layer 100 extends into the third groove G3 and the fourth groove G4.

Optionally, the method further includes forming a passivation layer 12 on a side of the source electrode 10 and the drain electrode 11 of the respective one of the plurality of thin film transistors TFT in the functional area FA. Optionally, the source electrode 10 and the drain electrode 11 of the respective one of the plurality of thin film transistors TFT are connected to the active layer 8 respectively through the third grooves G3 and the fourth groove G4.

In some embodiments, referring to FIG. 12, the method further includes depositing a second electrode material layer 130 on a side of the source electrode 10 and the drain electrode 11 away from the base substrate 1; and patterning the second electrode material layer 130 to form one of a first electrode 13 and a second electrode 13' (shown in FIG. 1) of a respective one of a plurality of light emitting elements LE in the functional area FA, and the first enclosure ring 17. Optionally, the first electrode 13 is electrically connected to the drain electrode 11 through the passivation layer 12.

In some embodiments, referring to FIG. 2 and FIG. 13, the method further includes etching the precursor second enclosure ring 190. Optionally, etching the precursor second enclosure ring 190 includes etching the precursor second enclosure ring 190 using the first enclosure ring 17 as a mask plate and using an etchant that selectively etches the precursor second enclosure ring 190 over the first enclosure ring 17, to form a second enclosure ring 19. Optionally, a first recess R1 is formed between a first lateral side L1 of the second enclosure ring 19 and the first enclosure ring 17, and a second recess R2 is formed between a second lateral side L2 of the second enclosure ring 19 and the first enclosure ring 17. Optionally, etching the precursor second enclosure ring 190 includes using a dry etching.

Subsequent to etching the precursor second enclosure ring, the second enclosure ring is obtained, and a maximum width of the first enclosure ring along the cross-enclosure direction is greater than a width along the cross-enclosure direction of a surface of the second enclosure ring in direct contact with the first enclosure ring. Optionally, an orthographic projection of the second enclosure ring on the base substrate substantially covers an orthographic projection on the base substrate of the surface of the second enclosure ring in direction contact with the first enclosure ring.

In some embodiments, referring to FIG. 2 and FIG. 14, the method further includes depositing one or more encapsulating materials on a side of the plurality of light emitting elements LE away from the base substrate 1. Optionally, the one or more encapsulating materials are deposited to form an encapsulated structure ES encapsulating the plurality of light emitting elements EL in the display area DA and a residual encapsulating structure ES' in the buffer area BA and on a side away from the base substrate 1.

Optionally, subsequent to depositing the one or more encapsulating materials, the residual encapsulating structure ES' is isolated from the encapsulated structure ES by at least the first groove G1.

Optionally, the encapsulating structure ES includes a first inorganic layer 6, a second inorganic layer 7, and an organic layer 15. Optionally, the residual encapsulating structure ES' includes a first residual inorganic layer 6' and a second residual inorganic layer 7'. For example, the first inorganic layer 6 and the first residual inorganic layer 6' are formed from a same material deposited in a same depositing process, the second inorganic layer 7 and the second residual inorganic layer 7' are formed from a same material deposited in a same depositing process. Due to the structure, the first inorganic layer 6 and the first residual inorganic layer 6' are naturally separated apart from each other, and the second inorganic layer 7 and the second residual inorganic layer 7' are naturally separated apart from each other.

In some embodiments, subsequent to forming the encapsulating structure ES and the residual encapsulating structure ES', the first groove G1 is formed, and the second groove G2 is formed.

Optionally, the method includes forming the first groove G1 in the buffer area BA, wherein forming the first groove G1 includes patterning the one or more insulating material layers IML to form the first part P1 in the functional area FA and the second part P2 in the buffer area BA. For example, the second part P2 is spaced apart from the first part P1 by at least the first groove G1.

In some embodiments, a region corresponding to the first groove is absent of any inorganic layer, so that the first part of the one or more insulating layer in the functional area and the second part of the one or more insulating layer in the buffer area are spaced apart from each other, and cracks formed in a portion of one or more insulating layer in the buffer layer are prevented from propagating into a portion of one or more insulating layer in the functional area. Moreover, the encapsulating structure in the functional area and the residual encapsulating structure in the buffer area are spaced apart from each other, so that cracks formed in a portion the residual encapsulating structure in the buffer area are prevented from propagating into the encapsulating structure. Therefore, no air and vapor can be transmitted into the function area via cracks, which can ensure a good display quality and long-term reliability of the display substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
a functional area; and
a buffer area substantially surrounding the functional area, wherein the functional area comprises a display area and a peripheral area between the display area and the buffer area;
one or more insulating layers on a base substrate, and in the functional area and the buffer area; and
an encapsulating structure on a side of the one or more insulating layers away from the base substrate, and encapsulating a plurality of light emitting elements in the display area;
wherein the one or more insulating layers comprise a first part in the functional area and at least a second part in the buffer area; and
the second part is spaced apart from the first part;
wherein the display substrate further comprises a first enclosure ring on a side of the second part away from the base substrate;
the first enclosure ring forms an enclosure substantially surrounding the functional area; and
a maximum width of the first enclosure ring along a cross-enclosure direction crossing the enclosure and from the display area toward the buffer area is greater than a minimum width of the second part along the cross-enclosure direction;
wherein the one or more insulating layers comprises a first insulating layer and a second insulating layer;
the first insulating layer comprises a first sub-part in the functional area and a second sub-part in the buffer area;
the second insulating layer comprises a third sub-part in the functional area and a fourth sub-part in the buffer area;
the first sub-part and the third sub-part form at least a portion of the first part;
the second sub-part and the fourth sub-part form at least a portion of the second part;
the first sub-part and the second sub-part are in a same layer and comprise a same insulating material;
the third sub-part and the fourth sub-part are in a same layer and comprise a same insulating material;
the second part is spaced apart from the first part by at least a first groove;
the display substrate further comprises a second enclosure ring between the second part and the first enclosure ring;
the second enclosure ring covers at least a lateral side of the second part;

the display substrate comprises a first recess between a first lateral side of the second enclosure ring and the first enclosure ring, and a second recess between a second lateral side of the second enclosure ring and the first enclosure ring;
the first recess is part of the first groove;
the second enclosure ring comprises a metallic layer; and
the first enclosure ring comprises a substantially transparent conductive layer.

2. The display substrate of claim 1, wherein the maximum width of the first enclosure ring along the cross-enclosure direction is greater than a width along the cross-enclosure direction of a surface of the second enclosure ring in direct contact with the first enclosure ring.

3. The display substrate of claim 1, further comprising a residual encapsulating structure in the buffer area and on a side of the first enclosure ring away from the base substrate;
wherein the residual encapsulating structure is spaced apart from the encapsulating structure by at least the first groove; and
a maximum width of the residual encapsulating structure along the cross-enclosure direction is greater than a minimum width of the first enclosure ring along the cross-enclosure direction.

4. The display substrate of claim 1, wherein the one or more insulating layers further comprise a third part in the buffer area, and on a side of the second part away from the first part; and
the third part is spaced apart from the second part by at least a second groove.

5. The display substrate of claim 4, wherein the first recess is part of the first groove; and
the second recess is part of the second groove.

6. The display substrate of claim 4, wherein the first insulating layer further comprises a fifth sub-part in the buffer area;
the second insulating layer further comprises a sixth sub-part in the buffer area;
the fifth sub-part and the sixth sub-part form at least a portion of the third part;
the first sub-part, the second sub-part, and fifth sub-part are in a same layer and comprise a same insulating material; and
the third sub-part, the fourth sub-part, and the sixth sub-part are in a same layer and comprise a same insulating material.

7. The display substrate of claim 4, wherein the second enclosure ring comprises a first lateral side, a second lateral side, and a third side away from the base substrate and connecting the first lateral side and the second lateral side;
the first groove abuts the first lateral side of the second enclosure ring; and
the second groove abuts the second lateral side of the second enclosure ring.

8. The display substrate of claim 7, wherein the first recess is between a side of the first enclosure ring closer to the base substrate and the first lateral side of the second enclosure ring; and
the second recess is between the side of the first enclosure ring closer to the base substrate and the second lateral side of the second enclosure ring.

9. The display substrate of claim 1, further comprising a plurality of thin film transistors in the functional area;
wherein a respective one of the plurality of thin film transistors comprises a source electrode and a drain electrode;

a respective one of the plurality of light emitting elements comprises a first electrode and a second electrode;

the second enclosure ring, the source electrode and the drain electrode of respective one of the plurality of thin film transistors are in a same layer and comprise a same material; and the first enclosure ring is in a same layer, and comprises a same material, as one of the first electrode and the second electrode.

10. The display substrate of claim 1, wherein a cross-section of the second part along a plane perpendicular to a main surface of the base substrate and along the cross-enclosure direction has a substantially trapezoidal shape.

11. The display substrate of claim 1, wherein a cross-section of a combination of the second part and the second enclosure ring along a plane perpendicular to a main surface of the base substrate and along the cross-enclosure direction has a substantially trapezoidal shape.

12. The display substrate of claim 1, wherein a first groove extends through the one or more insulating layers and exposes a surface of a portion of the base substrate.

13. A display substrate, comprising:
a functional area; and
a buffer area substantially surrounding the functional area, wherein the functional area comprises a display area and a peripheral area between the display area and the buffer area;
one or more insulating layers on a base substrate, and in the functional area and the buffer area; and
an encapsulating structure on a side of the one or more insulating layers away from the base substrate, and encapsulating a plurality of light emitting elements in the display area;
wherein the one or more insulating layers comprise a first part in the functional area and at least a second part in the buffer area; and
the second part is spaced apart from the first part;
wherein the display substrate further comprises a first enclosure ring on a side of the second part away from the base substrate;
the first enclosure ring forms an enclosure substantially surrounding the functional area; and
a maximum width of the first enclosure ring along a cross-enclosure direction crossing the enclosure and from the display area toward the buffer area is greater than a minimum width of the second part along the cross-enclosure direction;
wherein the one or more insulating layers comprises a first insulating layer and a second insulating layer;
the first insulating layer comprises a first sub-part in the functional area and a second sub-part in the buffer area;
the second insulating layer comprises a third sub-part in the functional area and a fourth sub-part in the buffer area;
the first sub-part and the third sub-part form at least a portion of the first part;
the second sub-part and the fourth sub-part form at least a portion of the second part;
the first sub-part and the second sub-part are in a same layer and comprise a same insulating material;
the third sub-part and the fourth sub-part are in a same layer and comprise a same insulating material;
the second part is spaced apart from the first part by at least a first groove;
the one or more insulating layers further comprise a third part in the buffer area, and on a side of the second part away from the first part; and the third part is spaced apart from the second part by at least a second groove;
wherein one or more insulating layers comprises a buffer layer, a gate insulating layer on a side of the buffer layer away from the base substrate, and an inter-layer dielectric layer on a side of the gate insulating layer away from the base substrate;
the buffer layer comprises a first buffer part in the functional area, a second buffer part in the buffer area and outside the enclosure, and a third buffer part in the buffer area and between the first buffer part and the second buffer part;
the gate insulating layer comprises a first gate insulating part in the functional area, a second gate insulating part in the buffer area and outside the enclosure, and a third gate insulating part in the buffer area and between the first gate insulating part and the second gate insulating part;
the inter-layer dielectric layer comprises a first dielectric part in the functional area, a second dielectric part in the buffer area and outside the enclosure, and a third dielectric part in the buffer area and between the first dielectric part and the second dielectric part; and
the second part comprises the third buffer part, the third gate insulating part, and the third dielectric part.

14. A display apparatus, comprising the display substrate of claim 1; and one or more integrated circuits electrically connected to the display substrate.

15. A method of fabricating a display substrate, comprising:
forming one or more insulating layers on a base substrate, and in a functional area and a buffer area, wherein the buffer area is substantially surrounding the functional area, and the functional area comprises a display area and a peripheral area between the display area and the buffer area;
forming an encapsulating structure on a side of the one or more insulating layers away from the base substrate to encapsulate a plurality of light emitting elements in the display area;
wherein the one or more insulating layers are formed to comprise a first part in the functional area and at least a second part in the buffer area; and
the second part is formed to be spaced apart from the first part;
wherein the method further comprises forming a first enclosure ring on a side of the second part away from the base substrate;
the first enclosure ring is formed to form an enclosure substantially surrounding the functional area; and
a maximum width of the first enclosure ring along a cross-enclosure direction cross the enclosure and from the display area toward the buffer area is greater than a minimum width of the second part along the cross-enclosure direction;
wherein forming the one or more insulating layers comprises:
forming one or more insulating material layers on the base substrate; and
forming at least a first groove in the buffer area, wherein forming the first groove comprises patterning the one or more insulating material layers to form the first part in the functional area and the second part in the buffer area, the second part spaced apart from the first part by at least the first groove;

the method further comprises:

depositing a first electrode material layer on a side of the one or more insulating layers away from the base substrate;

patterning the first electrode material layer to form a source electrode and a drain electrode of a respective one of a plurality of thin film transistors in the functional area, and a precursor second enclosure ring on a side of the second part away from the base substrate;

depositing a second electrode material layer on a side of the source electrode and the drain electrode away from the base substrate;

patterning the second electrode material layer to form one of a first electrode and a second electrode of a respective one of a plurality of light emitting elements in the functional area, and the first enclosure ring;

etching the precursor second enclosure ring using the first enclosure ring as a mask plate and using an etchant that selectively etches the precursor second enclosure ring over the first enclosure ring, to form a second enclosure ring, wherein a first recess is formed between a first lateral side of the second enclosure ring and the first enclosure ring, and a second recess is formed between a second lateral side of the second enclosure ring and the first enclosure ring;

depositing one or more encapsulating materials on a side of the plurality of light emitting elements away from the base substrate, wherein the one or more encapsulating materials are deposited to form an encapsulated structure encapsulating the plurality of light emitting elements in the display area and a residual encapsulating structure in the buffer area and on a side of the first enclosure ring away from the base substrate;

subsequent to depositing the one or more encapsulating materials, the residual encapsulating structure is isolated from the encapsulated structure by at least the first groove.

* * * * *